United States Patent [19]
Mijuskovic

[11] Patent Number: 5,172,078
[45] Date of Patent: Dec. 15, 1992

[54] DIFFERENTIAL OSCILLATOR WITH COMMON MODE CONTROL

[75] Inventor: Dejan Mijuskovic, Chandler, Ariz.

[73] Assignee: Motorola, Inc., Schaumburg, Ill.

[21] Appl. No.: 832,187

[22] Filed: Feb. 6, 1992

[51] Int. Cl.$^5$ ............................................. H03B 5/00
[52] U.S. Cl. ................................. 331/108 R; 331/186
[58] Field of Search ............... 331/108 R, 108 C, 175, 331/177 R, 185, 186; 330/310; 307/260, 265, 268

[56] References Cited

U.S. PATENT DOCUMENTS

| | | | |
|---|---|---|---|
| 4,152,675 | 5/1979 | Jett, Jr. | 331/186 |
| 4,876,463 | 10/1989 | Lyle | 307/265 |
| 5,057,702 | 10/1991 | Kitagawa | 307/268 |

Primary Examiner—Robert J. Pascal
Attorney, Agent, or Firm—Robert D. Atkins

[57] ABSTRACT

An oscillator circuit uses a differential oscillator and differential amplifier to generate a symmetrical single-ended output signal. The differential oscillator generates a differential oscillator signal having an adjustable zero-crossing point in response to a control signal. The differential amplifier converts the differential oscillator signal to the symmetrical single-ended output signal having a symmetrical waveform. Controlling the zero-crossing of the differential oscillator signal compensates for common mode variation in the differential amplifier and produces a single-ended output signal having a symmetrical waveform with 50% duty cycle. A matching amplifier operating in a self biasing mode produces the control signal.

15 Claims, 2 Drawing Sheets

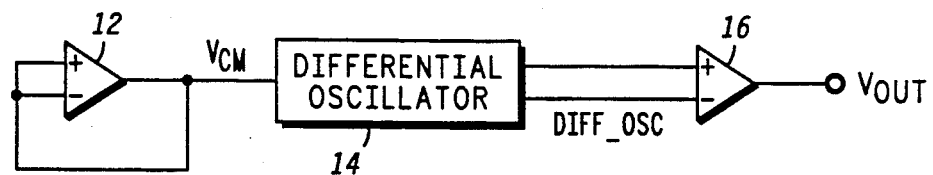
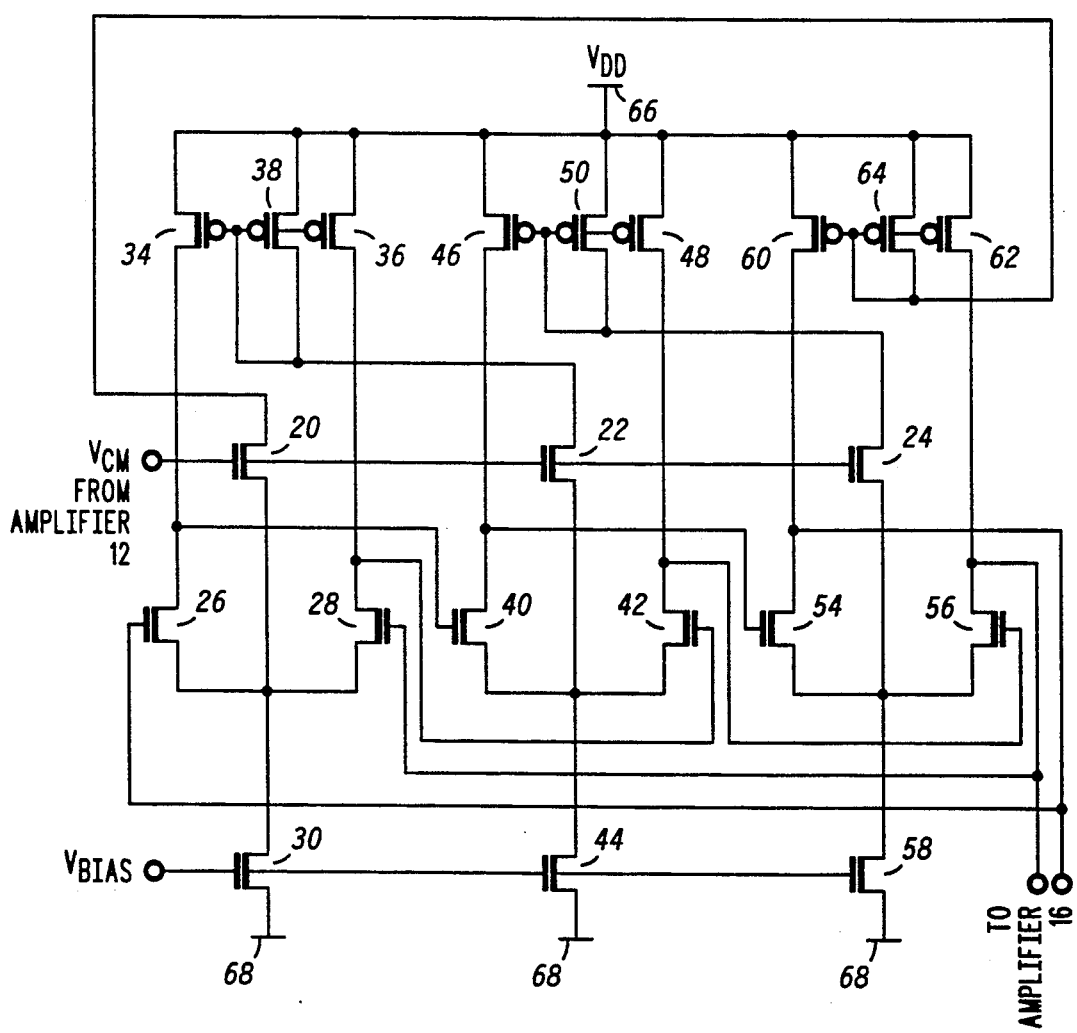

DIFFERENTIAL OSCILLATOR WITH COMMON MODE CONTROL

BACKGROUND OF THE INVENTION

The present invention relates in general to oscillator circuits and, more particularly, to a differential oscillator having a controllable zero-crossing level of the differential output signal.

Oscillator circuits are commonly used in electronic circuit design to generate an oscillating output signal. In a ring oscillator for example, an odd number of inverters are serially coupled input-to-output with the output of the last stage coupled back to the input of the first stage. Many applications require a 50% duty cycle for the oscillating output signal. For example, an oscillator may need to generate a symmetrical clock signal if the external logic clocks off both the rising and falling edges of the clock signal. The conventional ring oscillator has problems generating a symmetrical waveform because of delay differences through the inverter stages. The duty cycle of the oscillating signal may be off by as much as ±10% which is unacceptable in many applications.

A common solution to the problem of maintaining a 50% duty cycle is to design an oscillator to run at twice the desired frequency and then divide down the oscillating signal, for example through a D-type flipflop configured as a divide-by-two counter, to generate the 50% duty cycle waveform operating at the desired frequency. One problem with this solution is the need to operate the oscillator at twice the desired frequency. Since oscillators have an inherent upper frequency limit, dependent on materials and processing, such a solution limits the useable bandwidth of the oscillator by one-half.

Therefore, a need exists for an improved oscillator circuit generating a high frequency oscillating symmetrical waveform with a 50% duty cycle.

SUMMARY OF THE INVENTION

Briefly stated, the invention comprises an oscillator circuit comprising a differential oscillator responsive to a first control signal for adjusting a zero-crossing point of a differential output signal, and a differential amplifier having inverting and non-inverting inputs coupled for receiving the differential output signal of the differential oscillator for providing a symmetrical single-ended output signal.

In another aspect, the present invention comprises a differential oscillator circuit comprising first current supply means having an output for providing a first current of predetermined magnitude. First and second transistors have gates receiving first and second input signals, and sources coupled to the output of the first current supply means. A first current mirror circuit includes first and second outputs coupled to the drains of the first and second transistors, respectively. A second current supply means has an output for providing a second current of predetermined magnitude. Third and fourth transistors have gates coupled to the drains of the first and second transistors, respectively, and sources coupled to the output of the second current supply means. A second current mirror circuit includes an input receiving a second control signal, and first and second outputs coupled to the drains of the third and fourth transistors, respectively. A fifth transistor includes a gate receiving the first control signal, a source coupled to the sources of the third and fourth transistors, and a drain coupled to the input of the first current mirror circuit.

BRIEF DESCRIPTION OF THE DRAWING

FIG. 1 is a block diagram illustrating an improved oscillator circuit;

FIG. 2 is a schematic diagram illustrating the differential oscillator of FIG. 1.

DETAILED DESCRIPTION OF THE PREFERRED EMBODIMENT

Figure 3:
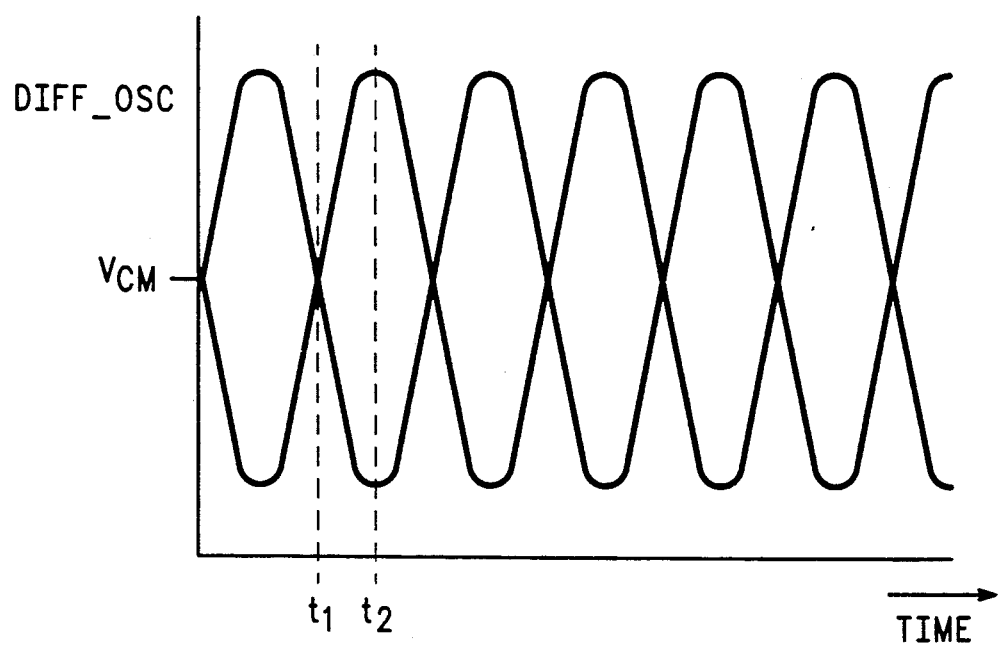
FIGS. 3 and 4 are waveform plots useful in the explanation of the invention.

An oscillator circuit 10 is shown in FIG. 1 suitable for manufacturing as an integrated circuit using conventional integrated circuit processes. Differential amplifier 12 generates a common mode control signal $V_{CM}$ by connecting its output to the inverting and non-inverting inputs in a self-biasing configuration. The $V_{CM}$ control signal is applied to differential oscillator 14 for generating a differential oscillating signal DIFF_OSC operating at say 100 MHz with a zero-crossing determined by the $V_{CM}$ control signal. Differential amplifier 16 converts the differential oscillator signal DIFF OSC to a symmetrical single-ended output signal $V_{OUT}$ having 50% duty cycle.

Further detail of differential oscillator 14 is shown in FIG. 2 including transistors 20, 22 and 24 each having a gate coupled for receiving the $V_{CM}$ control signal. The source of transistor 20 is coupled together with the sources of differential transistor pair 26 and 28 to the drain of current source transistor 30. The drains of transistors 26 and 28 are coupled to the drains of transistors 34 and 36, respectively. The gates of transistors 34 and 36 are coupled together to the gate and drain of transistor 38 and to the drain of transistor 22. Transistors 34–38 operate as a current mirror circuit with an input at the drain of diode-configured transistor 38, and first and second outputs at the drains of transistors 34 and 36 for supplying current to differential transistor pair 26–28. Transistors 20 and 26–38 form a first stage of differential oscillator 14.

The drains of transistors 26 and 28 are also coupled to the gates of transistors 40 and 42, respectively. The common sources of transistors 22, 40 and 42 are coupled to the drain of current source transistor 44, while the drains of transistors 40 and 42 are coupled to the drains of transistors 46 and 48. The gates of transistors 46 and 48 are coupled together to the gate and drain of transistor 50 and to the drain of transistor 24. Transistors 46–50 operate as a current mirror circuit with an input at the drain of diode-configured transistor 50, and first and second outputs at the drains of transistors 46 and 48 for supplying current to differential transistor pair 40–42. Transistors 22 and 40–50 form a second stage of differential oscillator 14.

The drains of transistors 40 and 42 are also coupled to the gates of transistors 54 and 56 which include common sources with the source of transistor 24 coupled to the drain of current source transistor 58. The drains of transistors 54 and 56 are coupled to the drains of transistors 60 and 62, respectively. The common gates of transistors 60 and 62 are coupled together to the gate and drain of transistor 64 and to the drain of transistor 20. The drains of transistors 54 and 56 are also coupled to the gates of transistors 26 and 28 and to the non-inverting and inverting inputs of differential amplifier 16, respectively. Transistors 60-64 operate as a current mirror circuit with an input at the drain of diode-configured transistor 64, and first and second outputs at the drains of transistors 60 and 62 for supplying current to differential transistor pair 54-56. Transistors 24 and 54-64 form a third stage of differential oscillator 14.

Transistors 34-38, 46-50 and 60-64 receive a positive power supply potential $V_{DD}$ (5.0 volts) from power supply conductor 66. The gates of transistors 30, 44, and 58 receive bias potential $V_{BIAS}$ operating at 1.5 volts, or other convenient value, for conducting a constant current through each. The sources of transistors 30, 44, and 58 are coupled to power supply conductor 68 operating at ground potential.

The operation of oscillator 14 proceeds as follows. With no common mode variation, potential developed at the drains of any differential transistor pair, say transistors 40 and 42, shift differentially and the common source potential remains substantially constant. If the gate potentials of transistors 40 and 42 increase common mode (both increase by the same amount) the source potential shifts up as well and reduces the gate-to-source junction potential ($V_{GS}$) of transistor 22. The current through transistor 22 decreases accordingly and reduces the gate drive of transistors 34-38. With smaller currents flowing through transistor 34 and 36, the potentials at the drains of transistors 26 and 28 decrease to compensate for the common mode increase at the gates of transistors 40-42. Thus, common mode variation in the differential transistor pair 40-42 is feed back via transistors 22 and 38 to correct the differential outputs of transistor pair 26-28 and compensate for the common mode variation. Likewise, common mode variation in differential transistor pair 26-28 feeds back through transistor 20 and 64 to cancel common mode variations developed at the drains of transistors 54-56. Furthermore, common mode variation in differential transistor pair 54-56 feeds back via transistors 24 and 50 to correct for variation at the drains of transistors 40-42.

As part of the present invention, a differential oscillator signal DIFF_OSC is developed at the drains of transistors 54 and 56 as shown in FIG. 3 having a symmetrical waveform with a 50% duty cycle. Another option is to tap the differential oscillator signal DIFF_OSC at the drains of transistors 26-28 or transistors 40-42. The zero-crossing point ($V_{ZC}$) is controlled by the $V_{CM}$ control signal. The $V_{CM}$ control signal regulates the gate potential of transistors 20, 22 and 24 to control the feed back to the respective previous differential transistor stage. Each differential transistor stage is regulated to compensate for the common mode variation.

The purpose of amplifier 16 is to convert the differential waveform to a single-ended output signal $V_{OUT}$. However, amplifier 16 is typically sensitive to common mode variation in the differential signal DIFF_OSC. Thus, it is necessary to use the $V_{CM}$ control signal to adjust the zero-crossing $V_{ZC}$ of the differential oscillator signal DIFF_OSC. Increasing the $V_{CM}$ control signal moves the $V_{ZC}$ level up in FIG. 3 and decreasing the $V_{CM}$ control signal moves the $V_{ZC}$ point down.

Figure 4:
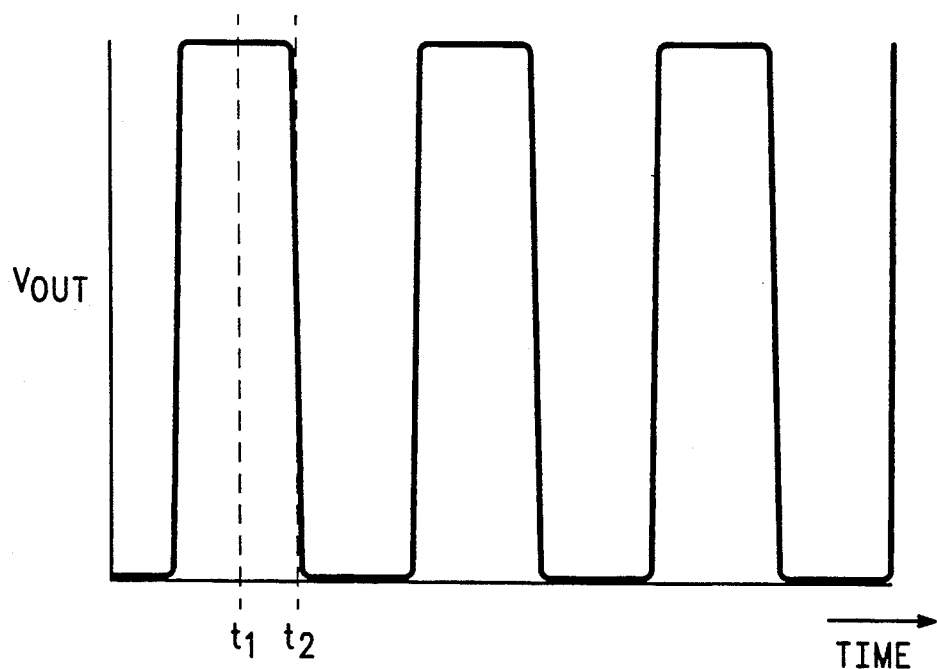

By properly controlling the $V_{CM}$ control signal, amplifier 16 is desensitized to common mode variation by matching the zero-crossing point of the differential oscillator signal DIFF_OSC to the inherent common mode offset of the amplifier. This maintains a 50% duty cycle with accuracy of ±2% for the single-ended output signal $V_{OUT}$ as shown in FIG. 4. Amplifier 12 provides such a $V_{CM}$ control signal by feeding back its output signal common mode to the inverting and non-inverting inputs in a self-biasing configuration. Amplifiers 12 and 16 are matched with the same response to common mode variation. Thus, common mode variations, due for example to changes in temperature, are reflected in the $V_{CM}$ control signal which controls differential oscillator 14 to adjust the zero-crossing of the differential oscillator signal DIFF_OSC thereby countering the common mode variation of amplifier 16 and providing the single-ended output signal $V_{OUT}$ as shown in FIG. 4. The time delay between the zero-crossing of the DIFF OSC signal at time $t_1$ in FIG. 3 and the transition of the $V_{OUT}$ signal at time $t_2$ in FIG. 4 is attributed to the delay through amplifier 16.

Hence, what has been provided is a novel differential oscillator providing a differential output signal with a controllable zero-crossing to a differential amplifier which cancels common mode variation and generates a symmetrical single-ended output waveform. While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. An oscillator circuit, comprising:
    a differential oscillator responsive to a first control signal for adjusting a zero-crossing point of a differential output signal; and
    a differential amplifier having inverting and non-inverting inputs coupled for receiving said differential output signal of said differential oscillator for providing a symmetrical single-ended output signal.

2. The differential oscillator of claim 1 wherein said differential oscillator includes:
    first current supply means having an output for providing a first current of predetermined magnitude;
    first and second transistors each having a gate, a drain, and a source, said gates receiving first and second input signals, said sources being coupled to said output of said first current supply means;
    a first current mirror circuit having an input and first and second outputs, said first and second outputs being coupled to said drains of said first and second transistors respectively;
    second current supply means having an output for providing a second current of predetermined magnitude;
    third and fourth transistors each having a gate, a drain, and a source, said gates being coupled to said drains of said first and second transistors respectively, said sources being coupled to said output of said second current supply means;
    a second current mirror circuit having an input and first and second outputs, said input receiving a second control signal, said first and second outputs being coupled to said drains of said third and fourth transistors respectively; and
    a fifth transistor having a gate, a drain, and a source, said gate receiving said first control signal, said source being coupled to said sources of said third and fourth transistors, said drain being coupled to said input of said first current mirror circuit.

3. The differential oscillator of claim 2 wherein said differential oscillator further includes:
    third current supply means having an output for providing a third current of predetermined magnitude;
    sixth and seventh transistors each having a gate, a drain, and a source, said gates being coupled to said drains of said third and fourth transistors respectively, said sources being coupled to said output of said third current supply means, said drains being coupled to said gates of said first and second transistors respectively for providing said first and second input signals, said drains further providing the differential output signal of the differential oscillator;
    a third current mirror circuit having an input and first and second outputs, said first and second outputs being coupled to said drains of said sixth and seventh transistors respectively;
    an eighth transistor having a gate, a drain, and a source, said gate receiving said first control signal, said source being coupled to said sources of said sixth and seventh transistors, said drain being coupled to said input of said second current mirror circuit for providing said second control signal; and
    a ninth transistor having a gate, a drain, and a source, said gate receiving said first control signal, said source being coupled to said sources of said first and second transistors, said drain being coupled to said input of said third current mirror circuit.

4. The differential oscillator of claim 3 wherein said first current mirror circuit includes:
    a tenth transistor having a gate, a drain, and a source, said gate and drain being coupled to said drain of said fifth transistor, said source being coupled to a first power supply conductor;
    an eleventh transistor having a gate, a drain, and a source, said gate being coupled to said gate of said tenth transistor, said source being coupled to said first power supply conductor, said drain being coupled to said drain of said first transistor; and
    a twelfth transistor having a gate, a drain, and a source, said gate being coupled to said gate of said tenth transistor, said source being coupled to said first power supply conductor, said drain being coupled to said drain of said second transistor.

5. The differential oscillator of claim 4 wherein said second current mirror circuit includes:
    a thirteenth transistor having a gate, a drain, and a source, said gate and drain being coupled to said drain of said eighth transistor, said source being coupled to said first power supply conductor;
    a fourteenth transistor having a gate, a drain, and a source, said gate being coupled to said gate of said thirteenth transistor, said source being coupled to said first power supply conductor, said drain being coupled to said drain of said third transistor; and
    a fifteenth transistor having a gate, a drain, and a source, said gate being coupled to said gate of said thirteenth transistor, said source being coupled to said first power supply conductor, said drain being coupled to said drain of said fourth transistor.

6. The differential oscillator of claim 5 wherein said third current mirror circuit includes:
    a sixteenth transistor having a gate, a drain, and a source, said gate and drain being coupled to said drain of said ninth transistor, said source being coupled to said first power supply conductor;
    a seventeenth transistor having a gate, a drain, and a source, said gate being coupled to said gate of said sixteenth transistor, said source being coupled to said first power supply conductor, said drain being coupled to said drain of said sixth transistor; and
    an eighteenth transistor having a gate, a drain, and a source, said gate being coupled to said gate of said sixteenth transistor, said source being coupled to said first power supply conductor, said drain being coupled to said drain of said seventh transistor.

7. The differential oscillator of claim 6 wherein said first current supply means includes a nineteenth transistor having a gate, a drain, and a source, said gate receiving a bias potential, said drain being coupled to said sources of said first and second transistors, said source being coupled to a second power supply conductor.

8. The differential oscillator of claim 7 wherein said second current supply means includes a twentieth transistor having a gate, a drain, and a source, said gate receiving said bias potential, said drain being coupled to said sources of said third and fourth transistors, said source being coupled to said second power supply conductor.

9. The differential oscillator of claim 8 wherein said third current supply means includes a twenty-first transistor having a gate, a drain, and a source, said gate receiving said bias potential, said drain being coupled to said sources of said sixth and seventh transistors, said source being coupled to said second power supply conductor.

10. A differential oscillator circuit for providing a differential output signal having a controllable zero-crossing, comprising:
    first current supply means having an output for providing a first current of predetermined magnitude;
    first and second transistors each having a gate, a drain, and a source, said gates receiving first and second input signals, said sources being coupled to said output of said first current supply means;
    a first current mirror circuit having an input and first and second outputs, said first and second outputs being coupled to said drains of said first and second transistors respectively;
    second current supply means having an output for providing a second current of predetermined magnitude;
    third and fourth transistors each having a gate, a drain, and a source, said gates being coupled to said drains of said first and second transistors respectively, said sources being coupled to said output of said second current supply means;
    a second current mirror circuit having an input and first and second outputs, said input receiving a second control signal, said first and second outputs being coupled to said drains of said third and fourth transistors respectively; and
    a fifth transistor having a gate, a drain, and a source, said gate receiving said first control signal, said source being coupled to said sources of said third and fourth transistors, said drain being coupled to said input of said first current mirror circuit.

11. The differential oscillator circuit of claim 10 further comprising:
    third current supply means having an output for providing a third current of predetermined magnitude;
    sixth and seventh transistors each having a gate, a drain, and a source, said gates being coupled to said drains of said third and fourth transistors respectively, said sources being coupled to said output of said third current supply means, said drains being coupled to said gates of said first and second transistors respectively for providing said first and second input signals, said drains further providing the differential output signal of the differential oscillator circuit;

a third current mirror circuit having an input and first and second outputs, said first and second outputs being coupled to said drains of said sixth and seventh transistors respectively;

an eighth transistor having a gate, a drain, and a source, said gate receiving said first control signal, said source being coupled to said sources of said sixth and seventh transistors, said drain being coupled to said input of said second current mirror circuit for providing said second control signal; and a ninth transistor having a gate, a drain, and a source, said gate receiving said first control signal, said source being coupled to said sources of said first and second transistors, said drain being coupled to said input of said third current mirror circuit.

12. The differential oscillator circuit of claim 11 wherein said first current mirror circuit includes:
a tenth transistor having a gate, a drain, and a source, said gate and drain being coupled to said drain of said fifth transistor, said source being coupled to a first power supply conductor;
an eleventh transistor having a gate, a drain, and a source, said gate being coupled to said gate of said tenth transistor, said source being coupled to said first power supply conductor, said drain being coupled to said drain of said first transistor; and
a twelfth transistor having a gate, a drain, and a source, said gate being coupled to said gate of said tenth transistor, said source being coupled to said first power supply conductor, said drain being coupled to said drain of said second transistor.

13. The differential oscillator circuit of claim 12 wherein said second current mirror circuit includes:
a thirteenth transistor having a gate, a drain, and a source, said gate and drain being coupled to said drain of said eighth transistor, said source being coupled to said first power supply conductor;
a fourteenth transistor having a gate, a drain, and a source, said gate being coupled to said gate of said thirteenth transistor, said source being coupled to said first power supply conductor, said drain being coupled to said drain of said third transistor; and
a fifteenth transistor having a gate, a drain, and a source, said gate being coupled to said gate of said thirteenth transistor, said source being coupled to said first power supply conductor, said drain being coupled to said drain of said fourth transistor.

14. The differential oscillator circuit of claim 13 wherein said third current mirror circuit includes:
a sixteenth transistor having a gate, a drain, and a source, said gate and drain being coupled to said drain of said ninth transistor, said source being coupled to said first power supply conductor;
a seventeenth transistor having a gate, a drain, and a source, said gate being coupled to said gate of said sixteenth transistor, said source being coupled to said first power supply conductor, said drain being coupled to said drain of said sixth transistor; and
an eighteenth transistor having a gate, a drain, and a source, said gate being coupled to said gate of said sixteenth transistor, said source being coupled to said first power supply conductor, said drain being coupled to said drain of said seventh transistor.

15. A method of generating a symmetrical single-ended oscillator signal, comprising the steps of:
generating a differential oscillator signal;
adjusting a zero-crossing point of said differential oscillator signal with a control signal; and
converting said differential oscillator signal to the symmetrical single-ended oscillator signal.

* * * * *